United States Patent [19]

Lindner et al.

[11] Patent Number: 4,797,720

[45] Date of Patent: Jan. 10, 1989

[54] CONTROLLED BREAKOVER BIDIRECTIONAL SEMICONDUCTOR SWITCH

[75] Inventors: Richard Lindner, Bethlehem; Bertram R. Rex, Lehighton, both of Pa.

[73] Assignee: American Telephone and Telegraph Company, AT&T Bell Laboratories, Murray Hill, N.J.

[21] Appl. No.: 288,001

[22] Filed: Jul. 29, 1981

[51] Int. Cl.[4] .......................................... H01L 29/747
[52] U.S. Cl. ........................................ 357/39; 357/58;
357/13; 357/86; 307/302; 307/324; 307/239
[58] Field of Search .................. 357/38 A, 38 C, 38 E,
357/38 R, 38 T, 39, 13, 86; 307/302, 252 R, 252 B, 324

[56] References Cited

U.S. PATENT DOCUMENTS

| 3,196,330 | 7/1965 | Moyson | 317/235 |
| 3,275,909 | 9/1966 | Gutzwiller | 317/235 |
| 3,391,310 | 7/1968 | Gentry | 357/39 |
| 3,423,650 | 1/1969 | Cohen | 357/51 X |
| 3,907,615 | 9/1975 | Weijland | 357/39 X |
| 4,071,852 | 1/1978 | Kannam | 357/52 |
| 4,157,562 | 6/1979 | D'Altroy et al. | 357/39 |

OTHER PUBLICATIONS

Storm et al., "A Bilateral Silicon Switch", *IEEE Trans. on Electron Devices,* vol. ED-14, No. 6, pp. 330-333, Jun. 1967.

*Primary Examiner*—Martin H. Edlow
*Attorney, Agent, or Firm*—James H. Fox

[57] ABSTRACT

A two-terminal bidirectional semiconductor switching device comprising a body of silicon semiconductor material having in one portion a five-zone switching element and, in another portion integral therewith, a three-zone bidirectional voltage-sensitive breakdown element, there being means including another portion of the body connecting the three-zone element as a gating element to said five-zone element so as to trigger conduction therein bidirectionally when voltage breakdown occurs in either direction in the three-zone element.

11 Claims, 2 Drawing Sheets

CONTROLLED BREAKOVER BIDIRECTIONAL SEMICONDUCTOR SWITCH

This invention relates to semiconductor switches and, more particularly, to bidirectional switching devices which will turn on when supplied with triggering voltage within a narrow range.

BACKGROUND OF THE INVENTION

Bidirectional semiconductor switching devices of the gate-controlled type of controlling current are well known. In particular, one type of silicon-controlled rectifier comprises a silicon semiconductor body of five zones of alternating conductivity type from one major surface to the other. The gate or control contact is made to a zone adjacent to a terminal zone. Conduction in either direction is enabled, depending on the respective polarity of the voltage at the terminal zones when a trigger voltage is applied to the gate zone.

Ordinarily, the bidirectional switching device just described is triggered by separately generated gate voltages applied from external sources. For certain applications, it is desirable that there be provided a two-terminal device responsive to voltages applied across the device itself which are within a relatively narrow range to switch the element to a low impedance or ON condition. It is desirable that such a device be responsive to voltages of either polarity.

SUMMARY OF THE INVENTION

In accordance with the invention, a bidirectional semiconductor switching device comprises a body of silicon semiconductor material having in one portion a five-zone switching element and, in another portion integral therewith, a three-zone bidirectional voltage-sensitive breakdown element, there being means, including another portion of the body, connecting the three-zone element as a gating element to said five-zone element so as to trigger conduction therein when voltage breakdown occurs in the three-zone element.

More specifically, in accordance with one embodiment, there is formed in a surface-adjacent portion of the device a transistor-like configuration of three conductivity-type zones defining two p-n junctions. The three-zone configuration is arranged so as to be connected between a gate zone and a terminal zone of the five-zone switching element. The three-zone element shares external connection with the pair of main terminals of the five-zone switching element.

Accordingly, a voltage of either polarity applied to the main terminals of the device, which voltage is in excess of the breakdown voltage of the three-zone configuration, results in conduction therethrough, which in turn triggers the five-zone element into conduction.

The two p-n junctions of the three-zone transistor-like configuration are of the Zener type, exhibiting sharp voltage breakdown characteristics. In another aspect, if the two p-n junctions are formed with the appropriate spacing and impurity doping, they will exhibit the gain characteristics of a transistor and will carry current in the sustaining state after breakdown, and which current then will trigger the five-zone element into conduction.

Thus, the device in accordance with the invention is particularly suited to function as a telephone line termination unit in both tip and ring, which will break down precisely and conduct when subjected to operating voltages in the range, typically of greater than about 12 to 22 volts. In one type of testing mode to determine from a central office whether a shorting fault is located in the customer's premises or elsewhere, a relatively high voltage, typically 100 volts in series with a large resistor, is applied to the line. If the line is satisfactory to the termination unit, the unit will switch to the ON state and energize a capacitor-resistor circuit connected across the termination unit. If the holding current of the five-zone element is above the maximum current supplied from the central office, then the capacitor-resistor circuit in combination with the five-zone element alternately charges and discharges, thus exhibiting a distinctive characteristic at the test location. This indicates that the line is satisfactory to the termination unit, and therefore the fault is in the customer premises equipment.

One feature of the invention is a device which breaks down at operating voltages with preciseness to enable conduction so that testing modes using particular values of testing voltages under computer control can be used to evaluate transmission line conditions out to the location of the device.

A further feature is a two-terminal self-triggering element which has a relatively simple integrated semiconductor structure.

BRIEF DESCRIPTION OF THE DRAWINGS

The invention and its other objects and features will be more clearly understood from the following detailed description taken in conjunction with the drawings in which.

DETAILED DESCRIPTION

Figure 1:
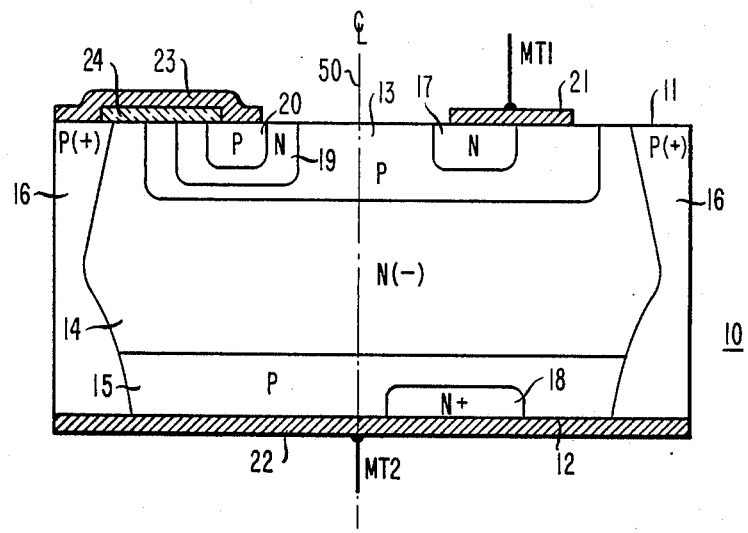
FIGS. 1, 4, and 5 are cross-section views of various embodiments in accordance with the invention.

Referring to FIG. 1, the device 10 is similar to bidirectional semiconductor switching devices of the gate-controlled type known in the prior art, with the exception, however, that a separate gate electrode is not provided, and the device illustrated is a two-terminal element. More specifically, the device 10 is a body of single crystal silicon semiconductor material having a first major surface 11 and a second major surface 12. For purposes of explanation, the portion to the right of the center line 50 is referred to as the first portion and to the left, the second portion. In the first portion and between the major surfaces 11 and 12, there are five zones of alternating conductivity type. At the first major surface, there is shown first terminal zone 17 of n-type conductivity and p-type zone 13 adjacent thereto of p-type conductivity. At the second major surface, there is shown the second terminal zone 18 and p-type zone 15 adjacent thereto. The fifth zone is the intermediate n-type zone 14, which is generally more lightly doped than the other zones, particularly the terminal n-type zones. The first main terminal (MT1) provided by the metal film electrode 21 makes ohmic contact to both terminal zone 17 and adjacent zone 13. The second main terminal (MT2) makes ohmic contact to the second terminal zone 18 and the zone 15 adjacent thereto. Terminal MT2 generally is applied to the entire second major surface of the device. The p-type conductivity zone 16, which is relatively highly doped, provides a protective enclosure at the edges of the body 10 and, as will be more fully explained hereinafter, provides a conduction path through the body.

The first portion of the device, as thus described, constitutes a symmetrical or bidirectional switching device when provided with suitable triggering input to the zone 13. As is known, the injection of, in this case, electrons from a suitable source into the zone 13 produces currents which, in conjunction with a voltage applied across the main terminals MT1 and MT2, result in the forward biasing of the p-n junctions between zones 13 and 14, and 14 and 15, sufficient to enable conduction through the first portion of the device. The direction of conduction will depend on the polarity of the voltage applied across the main terminals and may occur either by way of MT1 through p-type zone 13, n-type zone 14, p-type zone 15, n-type zone 18, to terminal MT2; or, from MT1 through n-type zone 17, p-type zone 13, n-type zone 14, p-type zone 15, and terminal MT2. Thus, conduction is enabled in either direction in a four-region device turned ON by a triggering voltage applied to a gate zone adjacent one terminal zone.

In accordance with this invention, triggering action is provided by the structure to the left of the center line, referred to as the second portion of the body. In this second portion, there are three significant zones 13, 19, and 20 of alternating conductivity type defining a pair of PN junctions. One of the three zones is p-type conductivity zone 13, which is common also to the first portion of the body. Within p-type zone 13 and wholly encompassed thereby is n-type zone 19, and likewise within zone 19 and wholly encompassed thereby is p-type zone 20. The three zones of pnp configuration each have a common surface coincident with the first major surface 11.

An interconnecting element 23, typically a metal film, is in ohmic contact with p-type zone 20 and heavily doped p-type enclosing zone 16. The element 23 is insulated from other portions of the body by the dielectric film 24. As previously noted, zone 16 has a surface common to the second major surface and in contact with the second main terminal constituted by the metal film 22. Thus, p-type zone 20 is directly connected to MT2. The p-n junctions defined by the successive zones 20, 19 and 13 are tailored to function as breakdown diodes of the Zener type so that the application of a particular voltage of either polarity will produce breakdown of whichever of the pair of junctions is reverse biased, thereby resulting in conduction through the pnp configuration. Note that the voltage is applied across MT1 and MT2, inasmuch as MT1 is directly connected to p-type zone 13, and MT2 is directly connected to p-type zone 20.

Figure 2:
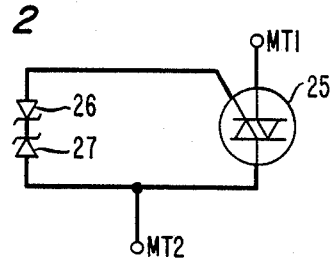
FIGS. 2 and 3 are circuit equivalents illustrating the device in accordance with the invention.
Figure 3:
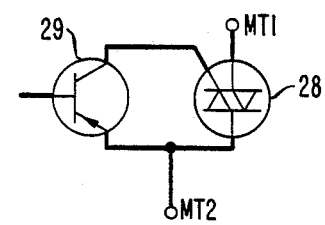

The circuit equivalent of the device of FIG. 1 is illustrated in FIGS. 2 and 3. In FIG. 2, the symbol 25 represents a gate-controlled semiconductor switch of the TRIAC type, having main terminals MT1 and MT2 and a gate connection connected from the gate of device 25 through a pair of oppositely poled Zener diodes 26 and 27 connected to MT2. Referring to FIG. 3, the pair of Zener diodes are shown as a pnp transistor 29 connected in the trigger circuit of the bidirectional semiconductor switch 28. More particularly, the transistor function is achieved by providing an appropriate spacing for the n-type conductivity zone 19 which, in effect, functions as the base zone of the transistor. Thus, there is provided in accordance with the invention a compact unitary device in which one portion contains a relatively high voltage bidirectional switching element composed of five conductivity-type zones and a second portion containing a bi-directional voltage-sensitive breakdown element having precise characteristics for producing the triggering effect in the first portion. In particular, the junctions between the zones 13, 29, and 20 are designed to break down and conduct at voltages typically in the range of from 12 to 22. Telephone line operating voltages typically are about 48 volts, sufficient to break down a pair of devices, installed in both tip and ring, at the interface between the entrance line and the customer's premises. Thus, the device conducts at operating voltages, enabling normal use of the telephone service. When a shorting fault occurs, a determination can be made as to whether the difficulty lies within the service provider's apparatus or on the customer's premises by applying to the line a relatively high voltage, such as about 100 volts. For example, if a shorting fault is present in the line before it reaches the maintenance termination unit, the line may show one form of response. If the difficulty is on the customer's premises, associated circuitry, in combination with the semiconductor device, may exhibit a different distinctive response.

The device illustrated in FIG. 1 is readily fabricated using well-known semiconductor fabrication techniques, including photolithographic processing for masking and impurity introduction using ion implantation and solid state diffusion. Processes of the type generally employed are set forth in U.S. Pat. No. 4,066,483, granted Jan. 3, 1978, to F.A. D'Altroy et al.

Figure 4:
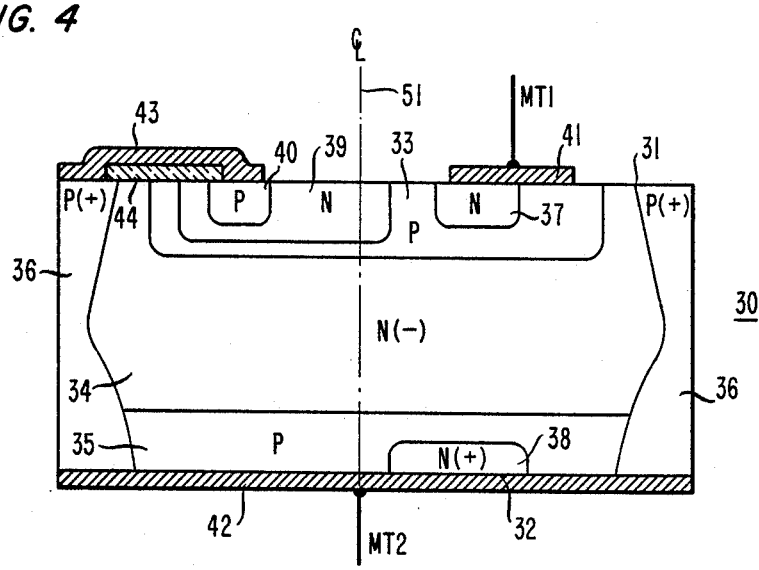

The embodiment shown in FIG. 4 is a variation of the embodiment of FIG. 1 in which the first terminal zone 40 of the second portion is offset within the intermediate zone 39 in a direction away from the first portion of the device. The embodiment of FIG. 4 otherwise is similar, having first major surface 31 and second major surface 32, terminal zones 37 and 38 of the first portion, and terminal-adjacent zones 33 and 35, along with intermediate zone 34. Main terminal MT1 is formed by metal electrode 41 and main terminal MT2 by film electrode 42. Highly doped p-type zone 36 provides edge protection and conduction as previously noted. The offset of zone 40 enhances the triggering action by the three-zone voltage-sensitive element.

Figure 5:
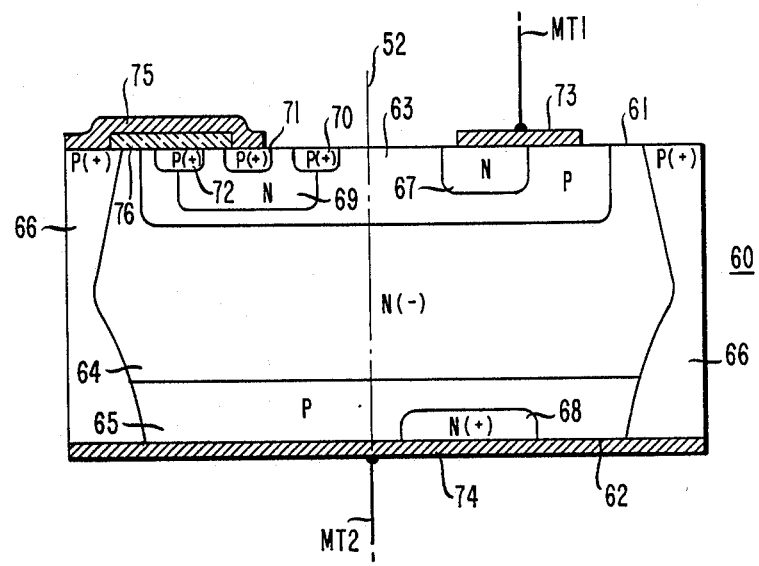

The embodiment of FIG. 5, having the voltage-sensitive element composed of a lateral transistor configuration, is otherwise similar to that described in FIGS. 1 and 4. P-type zone 71 constitutes the first terminal zone of the second portion of the device. P-type zones 70 and 72 may be separately formed zones or may be composed of a singular annular configuration or may be a series of spaced-apart zones. The zones 70 and 72 constitute a highly doped section of the p-type second terminal zone of the second portion. Further, the zones 70 and 72 are located at the boundary, that is, the p-n junction, between the intermediate zone 69 and the p-type second terminal zone 63 and at the first major surface 61. In this embodiment, fabrication is simplified from the standpoint of achieving a precise basewidth, as defined by the spacing between the p+zone 71 and the zones 70-72, which enables transistor current gain and the sustaining of conduction as previously described.

Figure 6:
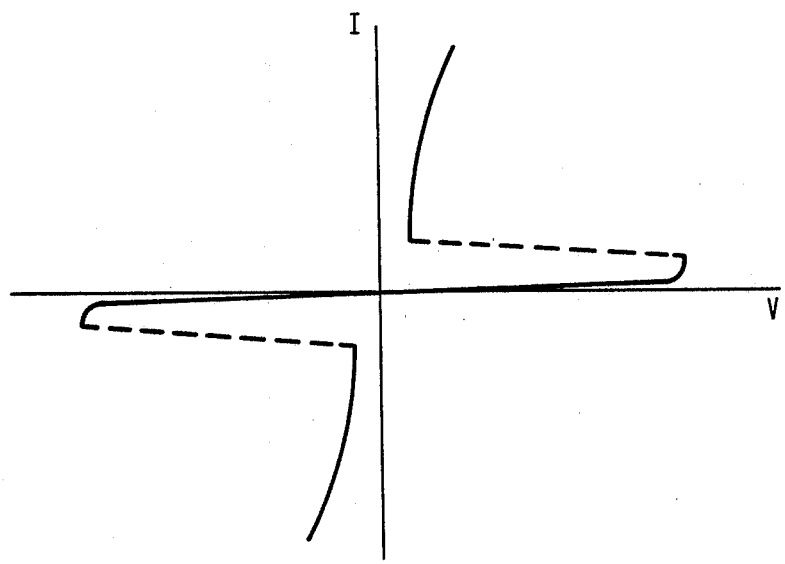
FIG. 6 is a graphical representation of the current-voltage characteristic exhibited by the device in accordance with the invention.

FIG. 6 illustrates the current-voltage characteristic of this type of device, in which the application of increasing voltage in either direction results in little increasing current until a point is reached at which there is sufficient rise in current to produce triggering, at which point the voltage drops and current rises with little increase in voltage.

In the embodiment in which the triggering element is formed by a pnp transistor rather than simply a pair of oppositely poled breakdown diodes, the characteristic shown in FIG. 6 may be expected to display a negative resistance characteristic immediately following the inception of conduction in the triggering element. That is, the curve will break back toward the origin as soon as the current begins to increase. This response is advantageous when in a testing mode for assuring establishment of the ON state of the bidirectional switching element when the shorting fault is highly resistive.

What is claimed is:

1. A bidirectional semiconductor switching device comprising a body of silicon semiconductor material having first and second major surfaces and having a first portion including a switching element and a second portion integral therewith including a bidirectional voltage-sensitive breakdown element, and further comprising means connecting said breakdown element as a gating element to said switching element for triggering conduction in either direction therein, CHARACTERIZED in that said breakdown element includes three zones of alternating conductivity type, the zones having a common surface coincident with the first major surface and comprising a first terminal zone, an intermediate zone, and a second terminal zone, with the first terminal zone being encompassed by the intermediate zone and the intermediate zone being encompassed by the second terminal zone, and further characterized in that the second portion includes a section of relatively higher conductivity at the intersection of the boundary between the intermediate zone and the second terminal zone, and the first major surface, whereby a desired breakdown voltage between said first terminal zone and said second terminal zone for triggering said conduction in said switching element is achieved.

2. A semiconductor device in accordance with claim 1 wherein said section of relatively higher conductivity is in the form of spaced-apart zones.

3. A semiconductor device in accordance with claim 1 wherein said section of relatively higher conductivity is in the form of a single annular configuration.

4. A semiconductor device in accordance with claim 1 wherein said conduction occurs when a voltage in the range of 12 to 22 volts is applied between said first and second terminal zones of said second portion.

5. A semiconductor device in accordance with claim in which said first portion extends from the first major surface to the second major surface and comprises five zones of alternating conductivity type, wherein a first main terminal on the first major surface is in ohmic contact with a first one of said five zones and also with a second one of said five zones adjacent thereto, and wherein a second main terminal on the second major surface is in ohmic contact with a third one of said five zones and also with a fourth one of said five zones adjacent thereto.

6. A semiconductor device in accordance with claim 5 wherein the second terminal zone of the second portion is common with the second of said five zones of the first portion.

7. A semiconductor device in accordance with claim 6 in which conductive means extend between the first terminal zone of the second portion and the second main terminal on the second major surface.

8. A semiconductor device in accordance with claim 7 in which said conductive means include an interconnecting element on the first major surface and a zone of high conductivity in the body extending from the first major surface to the second major surface.

9. A semiconductor device in accordance with claim 8 in which the interconnecting element is in ohmic contact with the first terminal zone of the second portion.

10. A semiconductor device in accordance with claim 9 in which the zone of high conductivity has a surface coincident with the second major surface, and the second main terminal makes ohmic contact to said coincident surface.

11. A semiconductor device in accordance with claim 6 in which the first terminal zone of the second portion is offset within the intermediate zone by which it is encompassed in a direction away from the first portion.

* * * * *

UNITED STATES PATENT AND TRADEMARK OFFICE
CERTIFICATE OF CORRECTION

PATENT NO. : 4,797,720

DATED : January 10, 1989

INVENTOR(S) : Richard Lindner and Bertram R. Rex

It is certified that error appears in the above-identified patent and that said Letters Patent is hereby corrected as shown below:

Column 6, claim 5, line 1, "claim" should read --claim 1--.

Signed and Sealed this

Sixth Day of June, 1989

Attest:

DONALD J. QUIGG

Attesting Officer

Commissioner of Patents and Trademarks